(12) United States Patent
Suh et al.

(10) Patent No.: US 7,170,086 B2
(45) Date of Patent: Jan. 30, 2007

(54) ORGANIC ELECTROLUMINESCENT DEVICE, ELECTRONIC DEVICE AND MANUFACTURING METHOD THEREOF

(75) Inventors: Min Chul Suh, Seongnam (KR); Mu-Hyun Kim, Suwon (KR); Byung Doo Chin, Seongnam (KR); Junhyo Chung, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/369,763

(22) Filed: Feb. 21, 2003

(65) Prior Publication Data

US 2004/0056266 A1 Mar. 25, 2004

(30) Foreign Application Priority Data

Sep. 19, 2002 (KR) .............. 10-2002-0057334

(51) Int. Cl.
*H01L 35/24* (2006.01)
(52) U.S. Cl. .............. 257/40; 257/59; 257/72; 257/99; 257/103
(58) Field of Classification Search .............. 257/40, 257/59, 72, 103, 744, 99; 428/690; 313/506
See application file for complete search history.

(56) References Cited

U.S. PATENT DOCUMENTS

| 4,356,429 | A | 10/1982 | Tang |
| 4,539,507 | A | 9/1985 | VanSlyke et al. |
| 4,720,432 | A | 1/1988 | VanSlyke et al. |
| 4,769,292 | A | 9/1988 | Tang et al. |
| 5,094,930 | A * | 3/1992 | Nomori et al. ............ 430/96 |
| 5,220,348 | A | 6/1993 | D'Aurelio |
| 5,247,190 | A | 9/1993 | Friend et al. |
| 5,256,506 | A | 10/1993 | Ellis et al. |
| 5,278,023 | A | 1/1994 | Bills et al. |
| 5,308,737 | A | 5/1994 | Bills et al. |
| 5,807,627 | A | 9/1998 | Friend et al. |
| 5,998,085 | A | 12/1999 | Isberg et al. |
| 6,087,196 | A | 7/2000 | Sturm et al. |

(Continued)

FOREIGN PATENT DOCUMENTS

EP 0 869 701 10/1998

(Continued)

OTHER PUBLICATIONS

A Thran and F. Faupel; Computer Simulation of Metal Diffusion in Polymers;Defect and Diffusion Forum vols. 143-147 (1997); pp. 903-908.

(Continued)

*Primary Examiner*—Leonardo Andujar
*Assistant Examiner*—Tan Tran
(74) *Attorney, Agent, or Firm*—Stein, McEwen & Bui, LLP

(57) ABSTRACT

An organic electroluminescent (EL) device includes a substrate, a first electrode disposed on the substrate, an emission layer comprising a polymer disposed on the first electrode, a second electrode formed on the emission layer, and a metal infiltration preventing layer, formed between the emission layer and the second electrode, for preventing a second electrode forming metal from infiltrating into the emission layer. A manufacturing method includes operations to prepare the EL device.

12 Claims, 6 Drawing Sheets

U.S. PATENT DOCUMENTS

| | | |
|---|---|---|
| 6,819,036 B2 * | 11/2004 | Cok .................. 313/318.01 |
| 6,893,743 B2 * | 5/2005 | Sato et al. ................ 428/690 |
| 2001/0004190 A1 * | 6/2001 | Nishi et al. ............... 313/506 |
| 2001/0041270 A1 | 11/2001 | Maruyama et al. |
| 2002/0034659 A1 * | 3/2002 | Nishi et al. ................ 428/690 |
| 2002/0055015 A1 * | 5/2002 | Sato et al. ................ 428/690 |
| 2002/0064679 A1 * | 5/2002 | Ishiskawa et al. .......... 428/690 |
| 2002/0117662 A1 | 8/2002 | Nii |
| 2003/0022019 A1 * | 1/2003 | Seo et al. ................. 428/690 |
| 2003/0072964 A1 * | 4/2003 | Kwong et al. ............. 428/690 |
| 2003/0162299 A1 * | 8/2003 | Hsieh et al. ................ 436/84 |
| 2003/0218418 A9 * | 11/2003 | Sato et al. ................ 313/504 |
| 2004/0048101 A1 * | 3/2004 | Thompson et al. ........ 428/690 |
| 2004/0156982 A1 * | 8/2004 | Maruyama et al. ........... 427/58 |
| 2004/0199016 A1 * | 10/2004 | Shirota et al. ............. 564/405 |

FOREIGN PATENT DOCUMENTS

| | | |
|---|---|---|
| JP | 10-153967 | 6/1998 |
| JP | WO98/24271 | 6/1998 |
| JP | 2002-184583 | 6/2002 |
| KR | 10-0254592 | 5/2000 |
| WO | 99/54385 | 10/1999 |

OTHER PUBLICATIONS

Michael Kiy, Iris Gamboni, Urs Suhner, Ivan Blaggio, Peter Gunter; Interface dependent electrical properties of organic light emitting devices in ultra high vacuum;Synthetic Metals 111-112 (2000); pp. 307-310.

F. Faupel, R. Willecke, A. Thran, M. Kiene. C. v. Bechtolsheim and T. Strunskus; Metal Diffusion in Polymers; Defect and Diffusion Forum vols. 143-147 (1997); pp. 887-902.

M. Fahlman, W.R. Salaneck; Surfaces and interfaces in polymer-based electronics: Surface Science 500 (2002): pp. 904-922.

* cited by examiner

US 7,170,086 B2

ORGANIC ELECTROLUMINESCENT DEVICE, ELECTRONIC DEVICE AND MANUFACTURING METHOD THEREOF

CROSS-REFERENCE TO RELATED APPLICATIONS

This application claims the benefit of Korean Patent Application No. 2002-57334 filed Sep. 19, 2002, in the Korean Intellectual Property Office, the disclosure of which is incorporated herein in its entirety by reference.

BACKGROUND OF THE INVENTION

1. Field of the Invention

The present invention relates to an organic electroluminescent (EL) device, and, more particularly, to an organic EL device having an emission layer comprising a polymer and having an improved lifetime characteristic.

2. Description of the Related Art

An electroluminescent (EL) device is a self-emission display using a phenomenon in which, when a current is applied to a fluorescent or phosphorescent organic compound film, light is emitted from the organic compound film by electron-hole recombination occurring. The EL device is lightweight, has non-complex components, and has a simplified manufacturing process, while exhibiting a high visibility and a wide viewing angle. Also, the EL device can present a motion picture display and can achieve a high color purity.

The organic EL device can be divided into two types: a passive matrix (PM) type, and an active matrix (AM) type according to a driving method thereof.

According to a PM drive type, a first set of electrodes and a second set of electrodes are arranged in a matrix configuration to cross each other to produce a pixel area at each intersection. When scan lines are sequentially selected, a pixel area selected by a data line signal instantaneously emits light. In a display apparatus of such a PM drive type, since the configuration and manufacturing process are simple, the manufacturing cost is advantageously low. However, a high resolution and large area display are difficult to achieve, and power consumption is high.

According to an AM drive type, a plurality of thin film transistors (TFTs) and pixel electrodes electrically connected to the TFTs, are arranged at the respective intersections of scan lines and data lines, and common electrodes are entirely covered over the TFTs and pixel electrodes. Since a pixel area is indirectly driven by a TFT as a switching device, voltages applied to the respective pixels are completely independently sustained, and the respective pixels are independently driven according to electrical signals applied to scan lines and data lines. An AM driven organic EL device can achieve a high resolution and large area display and provides a good picture quality while having smaller power consumption and a longer lifetime, compared to a PM driven organic EL device.

An organic EL device can also be divided into a low molecular (or a small molecular) organic EL device and a high molecular (or a polymeric) organic EL device according to a material used for forming an organic compound film.

A low molecular weight organic EL device is basically constructed such that a low molecular weight emission layer is formed between a first electrode and a second electrode, a hole transport layer (HTL) is formed between the emission layer and the first electrode, and an electron transport layer (ETL) is formed between the emission layer and the second electrode, thereby improving efficiency and lifetime characteristics (U.S. Pat. Nos. 4,356,429, 4,539,507, 4,720,432, and 4,769,292).

A high molecular weight organic EL device, as disclosed in U.S. Pat. No. 5,247,190, is constructed such that an emission layer is formed between a transparent, first electrode and a metallic, second electrode. However, such a high molecular weight EL device has poor efficiency and lifetime characteristics because work functions of the first and second electrodes and the highest occupied molecular orbital (HOMO) and the lowest unoccupied molecular orbital (LUMO) values of a polymer forming the emission layer are different from each other. To solve these problems, there has been proposed a method in which a metal having a work function value similar to the LUMO value of a polymer forming the emission layer is used as a second electrode forming material.

However, if the LUMO value of one selected from red (R), green (G) and blue (B) polymeric emission layers is adjusted to be substantially the same as a work function value of a cathode, the efficiencies of non-selected polymeric emission layers may deteriorate.

For realizing a full-color display using a polymeric organic EL device, an emission layer is formed by ink-jet printing (Japanese Patent Laid-open Publication No. 10-153967, WO 98/24271 and U.S. Pat. No. 6,087,196). The use of ink-jet printing reduces an amount of an emission layer forming material and allows large area patterning.

Another method for realizing a full-color display using a polymeric organic EL device is disclosed in U.S. Pat. No. 5,998,085, in which an emission layer is formed by laser induced thermal imaging (LITI).

As described above, in the polymeric organic EL device, a polymer for forming an emission layer acts as both an electron transport layer and a hole transport layer. Thus, a single emission layer is generally formed between the first and the second electrodes.

However, use of such a single emission layer makes a metal diffuse into the emission layer during deposition of the metal, considerably deteriorating a stability of the EL device (Surface Science 500 (2002) 904–922).

U.S. Pat. No. 5,807,627 discloses a polymeric organic EL device having a four-layered structure in which a first charge carrier injection layer, first and second layers made of a semiconductive conjugated PPV-based polymer, and a second charge carrier injection layer are sequentially stacked between the first and the second electrodes. As described above, a multilayered film that includes a charge carrier injection layer is formed between the first and the second electrodes to increase the efficiency of an organic EL device that is hindered by a polymer's poor capability in transporting electrons and holes.

In the organic EL device, however, to prevent a lower layer from being damaged when forming an upper layer in the manufacture of a multilayered film, polymers having different solubilities in an organic solvent for spin-coating should be used as materials for forming the upper and lower layers. Also, since spin-coating is employed in film formation, patterning of an emission layer is impossible, making full-color display difficult.

SUMMARY OF THE INVENTION

The present invention provides an organic EL device having improved lifetime and efficiency characteristics.

Additional aspects and advantages of the invention will be set forth in part in the description which follows and, in part, will be obvious from the description, or may be learned by practice of the invention.

In accordance with an aspect of the present invention, an organic EL device includes a substrate, a first electrode formed on the substrate, an emission layer comprising a polymer formed on the first electrode, a second electrode formed on the emission layer, and a metal infiltration preventing layer, formed between the emission layer and the second electrode, to prevent a second electrode metal from infiltrating into the emission layer.

The metal infiltration preventing layer may include at least one layer selected from a hole blocking layer and an electron transport layer.

The organic EL device according to the present invention may further comprise a hole injection layer between the first electrode and the emission layer.

Also, the organic EL device according to the present invention may further comprise an organic soluble hole transport layer between the hole injection layer and the emission layer.

In one embodiment, a TFT is disposed between the substrate and the first electrode, an insulator layer is disposed on the TFT, and the first electrode is connected to source/drain electrodes of the TFT through a via hole of the insulator layer.

In accordance with another aspect of the present invention, a method of forming an organic EL device comprises forming a first electrode on a substrate, forming an emission layer comprising a polymer on the first electrode, forming a metal infiltration preventing layer on the emission layer, and forming a second electrode on the metal infiltration preventing layer.

The organic EL device forming method according to the present invention may further include forming a hole injection layer between the first electrode and the emission layer. The hole injection layer may be formed by spin-coating a hole injection layer forming composition and annealing at 100 to 200° C.

Also, the organic EL device forming method according to the present invention may further include forming an organic soluble hole transport layer between the hole injection layer and the emission layer.

The emission layer may be formed by spin-coating, laser induced thermal imaging or ink-jet printing.

Also, the metal infiltration preventing layer may be formed by spin-coating or deposition. Prior to forming the metal infiltration preventing layer, annealing may be performed at 70 to 200° C.

BRIEF DESCRIPTION OF THE DRAWINGS

These and/or other features and advantages of the present invention will become apparent and more readily appreciated from the following description of the embodiments, with reference to the accompanying drawings in which.

DETAILED DESCRIPTION OF THE PREFERRED EMBODIMENTS

Figure 1A:
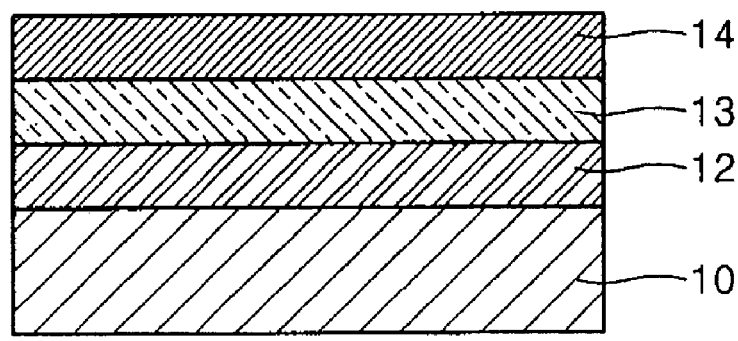
FIGS. 1A–1E are schematic diagrams of a stack structure of an organic EL device according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

An organic EL device according to an embodiment of the present invention has a metal infiltration preventing layer between an emission layer and a second electrode. The metal infiltration preventing layer preferably includes at least one layer selected from the group consisting of a hole blocking layer and an electron transport layer, but is not limited in view of a stack structure and composition of the layer provided that the layer selected is capable of preventing a metal for forming a second electrode from infiltrating into the emission layer.

In the organic EL device employing a polymeric emission layer, it is quite difficult to select a material for a common cathode, which will now be described in more detail. The range of the LUMO value of a polymer is broad, that is, from 2.3 to 3.5 eV. Thus, if the LUMO value of a blue (B) emission layer is adjusted to be substantially the same as the work function value of a cathode, the emission efficiencies of green (G) and red (R) emission layers deteriorate. However, according to the present invention, since the hole blocking layer and the electron transport layer serve as buffer layers, a common electrode can be used irrespective of R, G and B emission layers, while exhibiting excellent efficiency and lifetime characteristics. That is, the organic EL device according to the present invention provides a relatively wide option in selecting materials for a common electrode.

FIGS. 1A–1E are schematic diagrams of a stack structure of an organic EL device according to an embodiment of the present invention. Referring to FIG. 1A, an emission layer 12 comprising a polymer is stacked on a first electrode 10, a hole blocking layer 13 as a metal infiltration preventing layer is stacked on the emission layer 12, and the second electrode 14 is formed thereon.

Figure 1B:
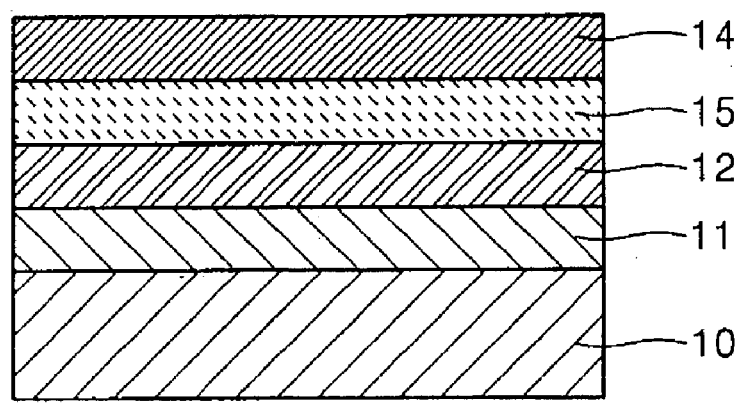

An organic EL device shown in FIG. 1B further includes a hole injection layer 11 between the first electrode 10 and the emission layer 12.

Figure 1C:
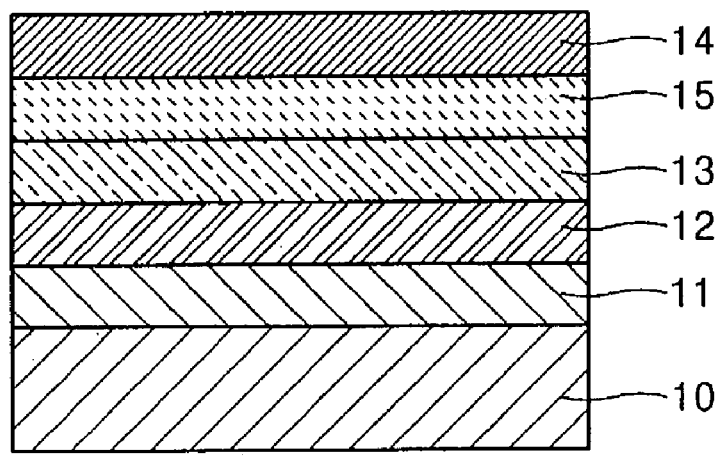

An organic EL device shown in FIG. 1C has the same stack structure as that shown in FIG. 1B, except that an electron transport layer 15 is disposed as a metal infiltration preventing layer, instead of the hole blocking layer 13.

Figure 1D:
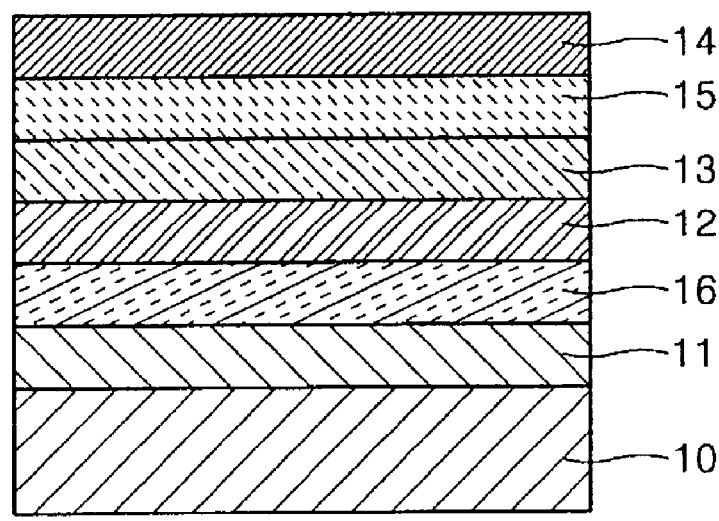

An organic EL device shown in FIG. 1D has the same stack structure as that shown in FIG. 1B, except that a bilayer structure having both a hole blocking layer 13 and an electron transport layer 15 sequentially stacked is used as a metal infiltration preventing layer, instead of a single layer consisting of the hole blocking layer 13.

Figure 1E:
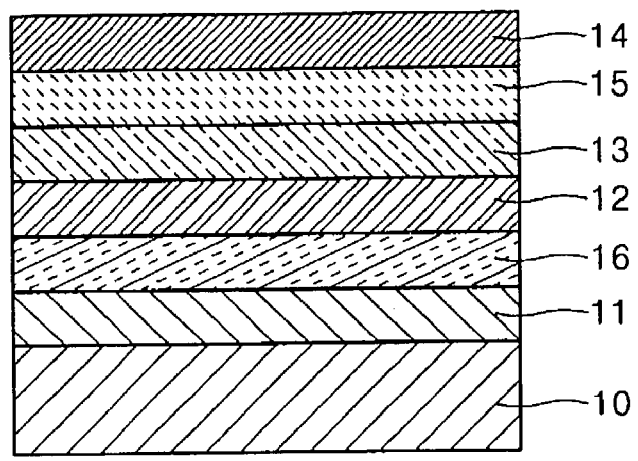

An organic EL device shown in FIG. 1E has the same stack structure as that shown in FIG. 1D, except that an organic soluble hole transport layer 16 is further disposed between the emission layer 12 and the hole injection layer 11. The organic soluble hole transport layer 16 serves to prevent impurities from infiltrating into the emission layer 12 from the hole injection layer 11.

Methods of manufacturing organic EL devices having a stack structure shown in FIGS. 1A through 1E will now be described. First, a patterned first electrode 10 is formed on a substrate (not shown). The substrate is a substrate used in a general organic EL device, preferably a glass substrate or a transparent plastic substrate having good transparency, surface evenness, manageablility and being waterproof. The thickness of the substrate is preferably about 0.3 to 1.1 mm.

A material for forming the first electrode 10 is a conductive metal or an oxide of the conductive metal capable of easily injecting holes, and examples thereof include ITO (Indium Tin Oxide), IZO (Indium Zinc Oxide), Ni, Pt, Au, Ir, and the like. The substrate having the first electrode 10 is washed and then subjected to UV/O$_3$ treatment. At the washing step, an organic solvent, such as isopropanol (IPA) or acetone, is generally used.

The hole injection layer 11 is optionally formed on the first electrode 10 in the washed substrate. The hole injection layer 11 reduces a contact resistance between the first electrode 10 and the emission layer 12, and increases a hole transporting capability of the first electrode 10 with respect to the emission layer 12, thus improving overall driving voltage and lifetime characteristics of the device. As a material for forming the hole injection layer 11, an aqueous material, such as PEDOT {poly(3,4-ethylenedioxythiophene)}/PSS(polystyrene parasulfonate), or a starburst material, is used. Such a material is spin-coated on the first electrode 10 and is dried to form the hole injection layer 11. The thickness of the hole injection layer 11 is about 30 to 200 nm to obtain a desired level of hole injection characteristic.

The drying temperature is preferably about 100 to 250° C., more preferably approximately 200° C.

The emission layer 12 is formed on the hole injection layer 11. When forming the emission layer 12 by laser induced thermal imaging (LITI), the organic soluble hole transport layer 16 may also be formed between the emission layer 12 and the hole injection layer 11, as shown in FIG. 1E. An organic soluble hole injection layer or transport layer may be used without an aqueous hole injection layer.

As a material for forming the organic soluble hole transport layer 16, any material having a hole transporting capability and having a good solubility in an organic solvent, such as toluene or xylene, can be used. Preferably, the material is a polymer having a hole transporting capability or a mixture of a polymer and a low molecular weight compound having a hole transporting capability. The polymer having a hole transporting capability is typically selected from the group consisting of arylamine-, perylene-, carbazole-, hydrazone-, stilbene- and pyrrole-based polymers and combinations thereof. The polymer for the mixture is generally selected from the group consisting of polystyrene, poly(styrene-butadiene) copolymer, polymethylmethacrylate, poly-α-methylstyrene, styrene-methylmethacrylate copolymer, polybutadiene, polycarbonate, polyethylterephthalate, polyestersulfonate, polyacrylate, fluorinated polyimide, transparent fluorine resin and transparent acryl resin and combinations thereof. The low molecular weight compound having a hole transporting capability is generally selected from the group consisting of arylamines, perylenes, carbazoles, stilbenes, pyrroles, starburst compounds containing derivatives and combinations thereof. The mixtures are preferably formed by dispersing 10 to 80 wt % of the low molecular weight compound in 10 to 20 wt % of the polymer.

The organic soluble hole transport layer 16 is formed by spin-coating. The thickness of the hole transport layer 16 is about 10 to 200 nm, preferably 20 nm.

The emission layer 12 is formed on the hole injection layer 11. In forming the emission layer 12, LITI, ink-jet coating, spin-coating or the like, may be employed. In the case of using LITI, the organic soluble hole transport layer 16 may also be formed on the hole injection layer 11.

The method of forming the emission layer 12 will now be described in more detail. Processing conditions for LITI are described, but not specifically limited, in Korean Patent No. 1998-051814 and U.S. Pat. Nos. 5,998,085, 5,220,348, 5,256,506, 5,278,023 and 5,308,737, the disclosures of which are incorporated herein by reference.

Figure 2:
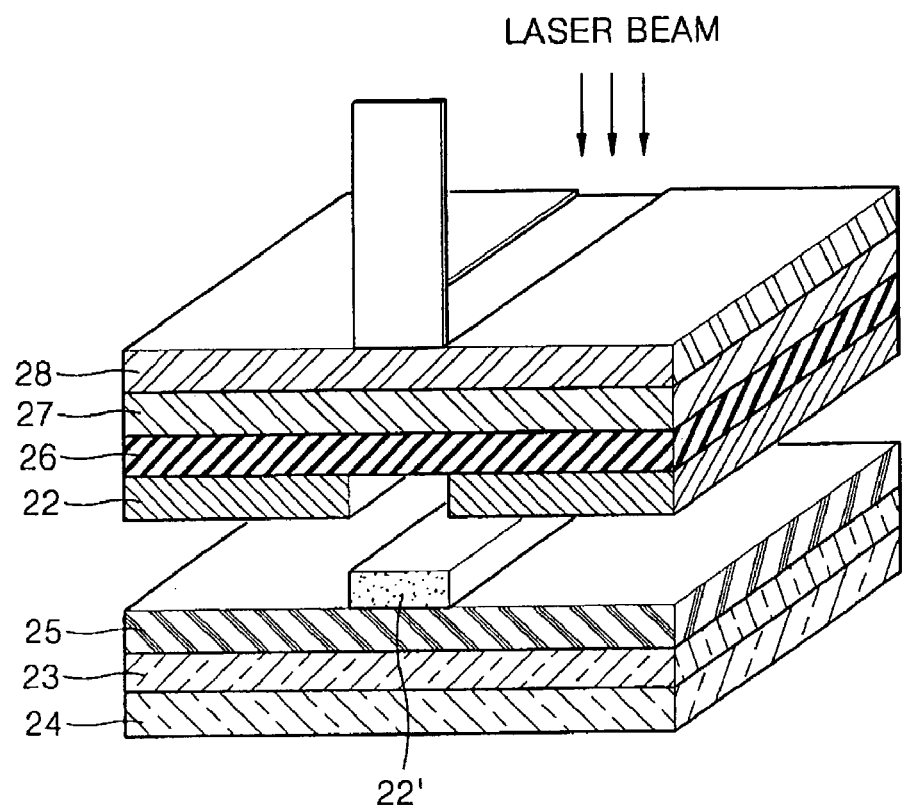
FIG. 2 is a schematic diagram illustrating a procedure of forming an emission layer according to an embodiment of the present invention by thermal transfer.

As shown in FIG. 2, an emission layer 22, an interlayer insulator layer 26 and a light to heat conversion (LTHC) layer 27 are sequentially formed on a support film 28 to produce a donor film. The emission layer 22 coated on the donor film in a predetermined thickness is transferred to a substrate to form a patterned emission layer 22' on the substrate by LITI. The thickness of the emission layer 22 is preferably about 10 to 100 nm. In FIG. 2, reference numeral 23 denotes a hole injection layer, reference numeral 24 denotes a first electrode, and reference numeral 25 denotes a hole transport layer, respectively.

A method of forming an emission layer by ink-jet printing may be performed under the same processing conditions as in a conventional EL device, e.g., conditions described in U.S. Pat. No. 6,087,196, the disclosure of which is incorporated herein by reference. A method of forming an emission layer by spin-coating will now be described.

First, one composition selected from compositions for forming R, G and B emission layers is spin-coated on the entire surface of the hole injection layer, and dried. Then, the resultant product is patterned to form one of the R, G and B emission layers. Likewise, the remaining emission layers are formed. Each of the compositions for forming the R, G and B emission layers includes an emissive material and an organic solvent. Preferably, the organic solvent is selected such that underlying layers are not dissolved.

Examples of the material for forming the emission layer according to the present invention include, but are not limited to, fluorene-based polymers, polyparaphenylene vinylenes or derivatives thereof, and spiro polyfluorene based polymers.

Also, the material for forming the emission layer according to the present invention may further include a dopant such as optically inactive matrix polymers, host polymers and small molecules having a greater band gap than emissive polymers to induce energy transfer, hole transporting polymers and small molecules, or electron transporting polymers and small molecules. The content of the dopant may vary depending on a material for forming the emission layer, preferably 5 to 80 wt % based on the total weight of the emission layer forming material. If the content of dopant is outside the above range, emission characteristics of the EL device deteriorate to an undesirable level.

Examples of the material for forming the emission layer according to the present invention include polystyrene, polystyrene-butadiene copolymer, polymethylmethacrylate, poly-α-methylstyrene, styrene-methyl methacrylate copolymer, polybutadiene, polycarbonate, polyethyleneterephthalate, polyestersulfonate, polysulfonate, polyacrylate, fluorinated polyimide, transparent fluorine based resin, transparent acryl based resin, arylamine, perylenes, pyrroles, hydrazones, carbazoles, stilbenes, starburst materials, oxadiazoles and the like.

The thickness of the emission layer is preferably about 10 to 100 nm. If the thickness of the emission layer is less than 10 nm, the emission efficiency is lowered. If the thickness of the emission layer is greater than 100 nm, the driving voltage is undesirably increased.

After forming the emission layer 12, annealing at 70 to 200° C. may be performed, improving the lifetime characteristic of the EL device.

A metal infiltration preventing layer is formed on the emission layer 12. The metal infiltration preventing layer is a hole blocking layer 13 and/or an electron transport layer 15 formed by deposition or spin-coating. The hole blocking layer 13 prevents excitons generated from a fluorescent material from migrating to the electron transport layer 15 or prevents holes from migrating to the electron transport layer 15.

In the case of forming the hole blocking layer 13 and/or the electron transport layer 15 by deposition, a second electrode can also be formed using an open mask. Thus, since it is not necessary to perform a complex manufacturing process, e.g., a process using a fine metal mask can be used to simplify the overall manufacturing process.

When forming the hole blocking layer 13 and/or the electron transport layer 15 by spin-coating, materials for forming a hole blocking layer and an electron transport layer are respectively dissolved in a solvent to prepare compositions for forming the hole blocking layer and the electron transport layer, followed by spin-coating onto a substrate and drying. The solvent includes a polar aprotic solvent, such as IPA or ethanol, which does not dissolve an emission layer.

Examples of the material for forming the hole blocking layer 13 include phenanthrolines (e.g., BCP manufactured by UDC CORP.), imidazoles, triazoles, oxadiazoles (e.g., PBD), aluminum complexes (UDC CORP.) BAlq having the following formula, and fluorinated compounds (e.g., CF-X or CF-Y manufactured by TOYOTA). In addition, any material having an ionizing potential of at least 0.5 eV greater than that of the material for forming an emission layer and having an intermediate electron affinity between the electron affinity of the emission layer and the electron affinity of the electron transport layer, may be used.

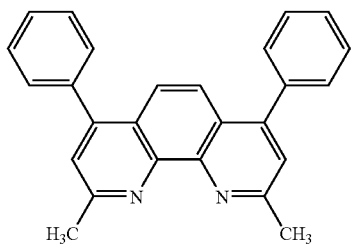

Phenanthroline Containing Organic Compound

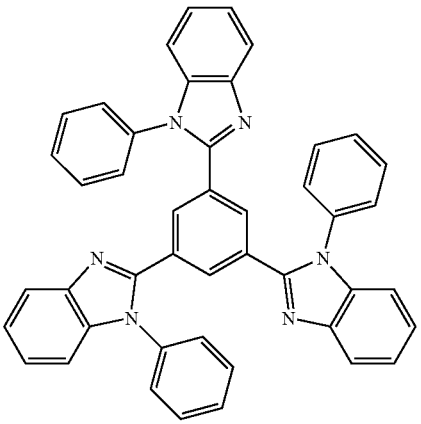

Imidazole Containing Organic Compound

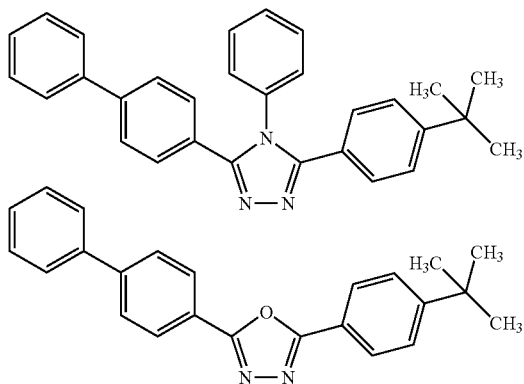

Triazole Containing Compound   Oxadiazole Containing Compound

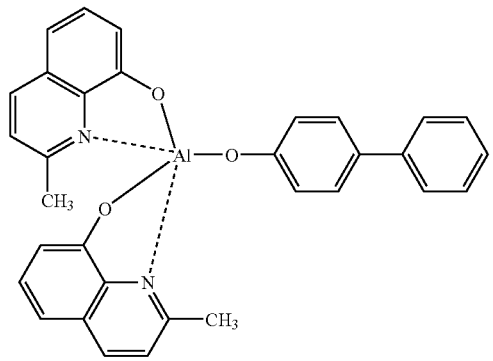

BAlq

-continued
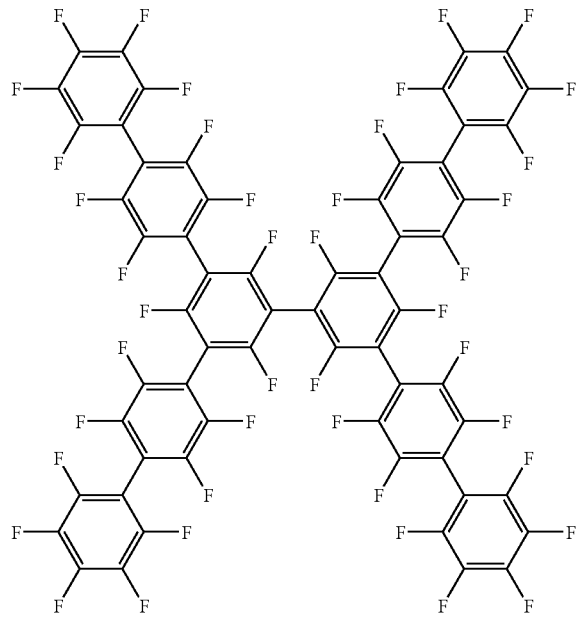
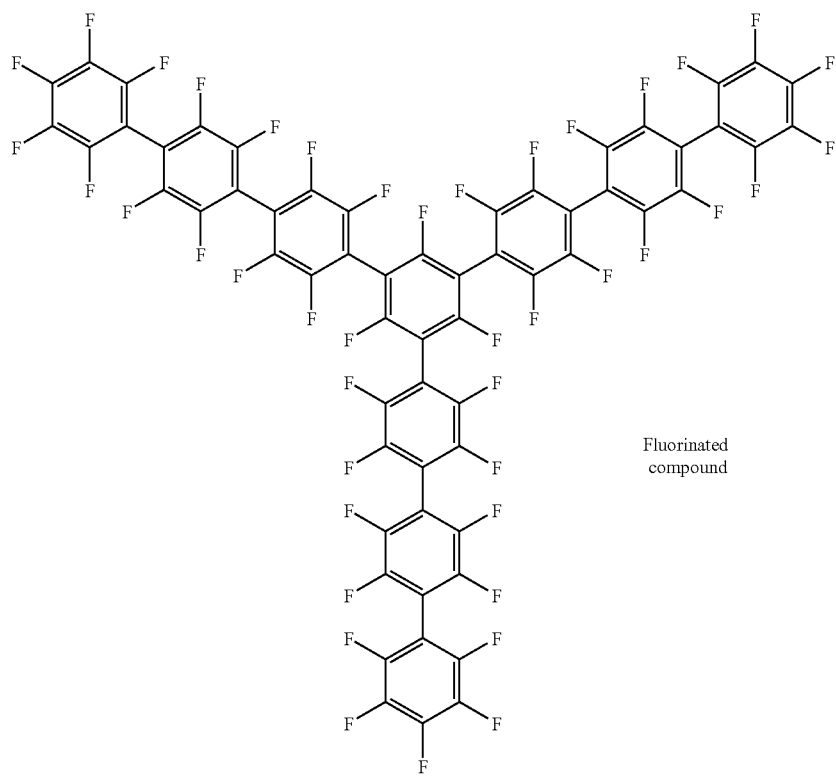
Fluorinated compound
Examples of the materials for forming the electron transport layer 15 include oxazoles, isooxazoles, triazoles, isothiazoles, oxadiazoles, thiadiazoles, perylenes, aluminum complexes (e.g., Alq3 (tris(8-quinolinolato)-aluminum), BAlq, SAlq, Almq$_3$, and gallium complexes (e.g., Gaq'$_2$OPiv, Gaq'$_2$Oac or 2(Gaq'$_2$)).
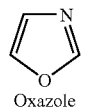
Oxazole -continued
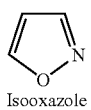
Isooxazole
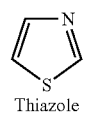
Thiazole
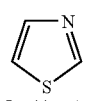
Isothiazole
Oxadiazole
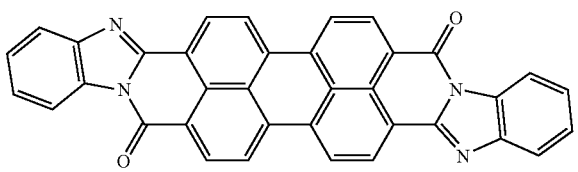
Thiadiazole
Pherylene compound
Alq₃
BAlq
-continued
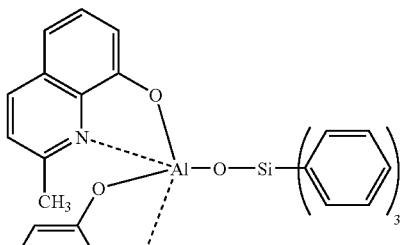
SAlq
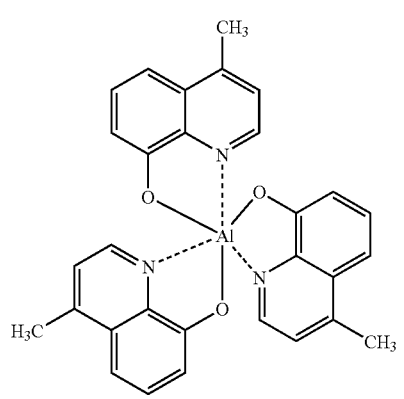
Almq₃
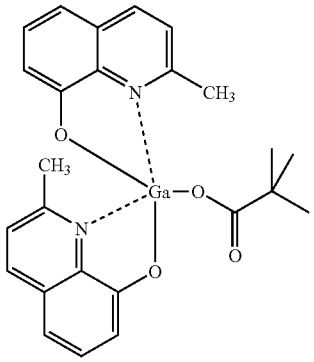
Gaq'₂OPiv
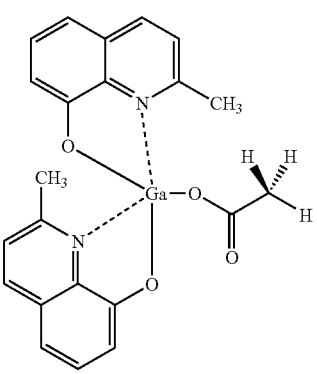
Gaq'₂OAc -continued

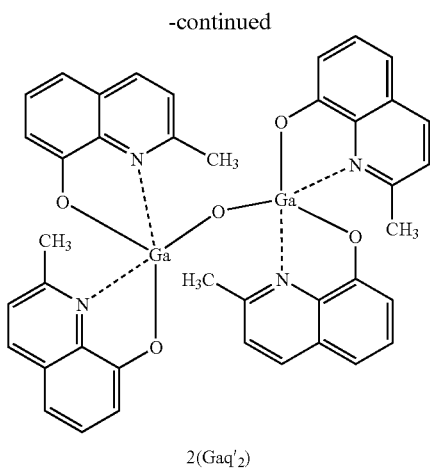

2(Gaq'$_2$)

The overall thickness of the metal infiltration preventing layer is about 0.1 to 50 nm, preferably 4 to 7 nm. If the thickness of the metal infiltration preventing layer is less than 0.1 nm, effects exhibited by various layers, including electron transporting capability or hole transporting capability, are lowered. If the thickness of the metal infiltration preventing layer is greater than 50 nm, color coordinates may change due to intrinsic illuminating effects from the metal infiltration preventing layer.

As described above, after forming the metal infiltration preventing layer, the second electrode 14 is formed thereon and the resultant product is encapsulated, thus completing an organic EL device.

The second electrode 14 is formed by depositing a metal having a small work function, for example, Li, Ca, LiF/Ca, LiF/Al, Al, Mg/Ag, BaF$_2$/Al, Yb, Mg, or Mg alloy. The thickness of the second electrode 14 is preferably about 5 to 300 nm.

Figure 3:
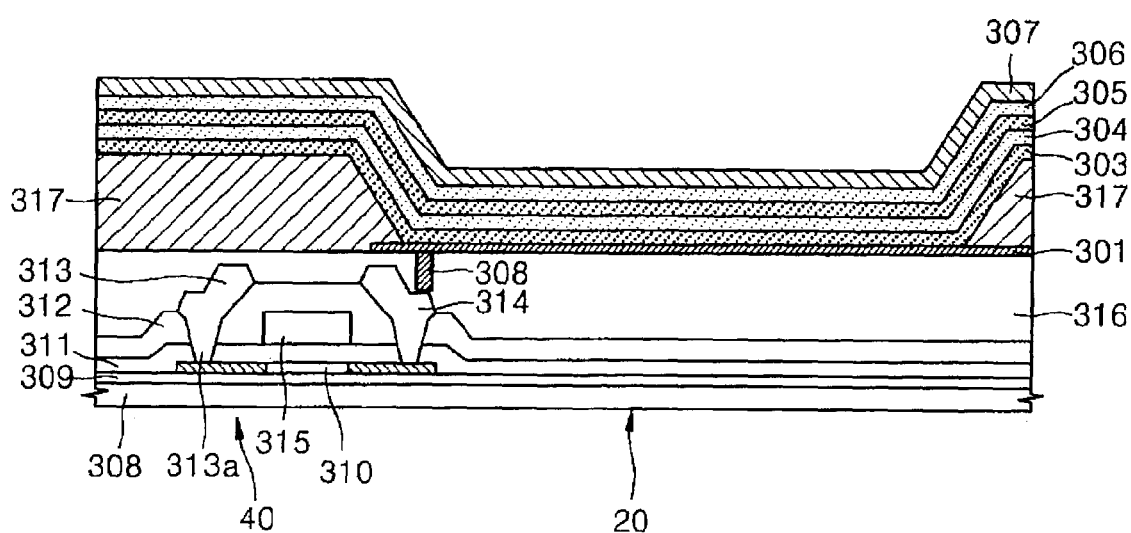
FIG. 3 is a schematic diagram of an organic EL device of an AM drive type according to an embodiment of the present invention.

FIG. 3 is a schematic diagram of an EL device of an AM drive type according to an embodiment of the present invention. Referring to FIG. 3, the organic EL device includes a pixel area 20 where an image is displayed, and a driver area 40 which drives the pixel area 20. The pixel area 20 includes a transparent substrate 308 and a plurality of insulator layers stacked thereon. The plurality of insulator layers include a buffer insulator layer 309, an intermediate insulator layer 311, an interlayer insulator layer 312 and a planarization layer 316 sequentially stacked.

A panel (pixel) area, including a first electrode, a hole injection layer, an emission layer and a second electrode, is formed on the planarization layer 316. In more detail, a hole injection layer 303, an emission layer 304, a hole blocking layer 305, an electron transport layer 306 and a second electrode 307 are sequentially formed on a first electrode 301. The hole injection layer 303, the emission layer 304, the hole blocking layer 305, the electron transport layer 306 and the second electrode 307 extend to the driver area 40, as shown in FIG. 3. Reference numeral 317 denotes an insulator layer.

The driver area 40 has TFTs for active driving. In other words, a buffer insulator layer 309 is formed on the transparent substrate 308, and a semiconductor layer 310 is provided thereon.

A gate electrode 315 is arranged above the semiconductor layer 310 to correspond thereto. The interlayer insulator layer 312 covering the gate electrode 315, a source electrode 313 and a drain electrode 314 are formed at opposite sides of the semiconductor layer 310 through a contact hole 313a, respectively.

The planarization layer 316 is formed over the source electrode 313 and the drain electrode 314. The first electrode 301 of the pixel area 20 is electrically connected to the drain electrode 314 through a via hole 318.

The present invention will be further described with reference to the following examples; however, it should be noted that the present invention is not restricted by said examples.

EXAMPLES 1–5

Examples 1–5 have the HBL layer and ETL layer thicknesses set forth in Table 1 and were prepared as follows. A patterned ITO substrate was washed and subjected to UV-O$_3$ treatment for 15 minutes, followed by spin-coating a composition for forming a hole injection layer (PEDOT/PSS manufactured by BAYER) to a thickness of 62 nm at a rate of 5000 rpm, and drying at 200° C. for 5 minutes, thus forming a hole injection layer.

A composition for forming an organic soluble hole transport layer was spin coated onto the hole injection layer to a thickness of 25 nm at a rate of 4000 rpm, thus forming an organic soluble hole transport layer. As the composition for forming the organic soluble hole transport layer, a mixture of 0.05 g of BFE polymer (manufactured by DOW CHEMICAL CO.) and 10 mL of toluene was used.

Separately, a transfer film for LITI for forming an emission layer was prepared as follows. As an emissive polymer, a mixture of BLUE J (manufactured by DOW CHEMICAL CO., LTD.) and polystyrene (manufactured by ALDRICH, MW=2500) mixed in equal amounts was used. The mixture was dissolved in toluene in an amount of 1.0–1.5 wt %, followed by stirring at 60° C. for 3 hours. The resultant mixture was coated on a support film to a thickness of 65 nm at a rate of 2000 rpm to form an emission layer, and an interlayer insulator layer and a photovoltaic conversion layer were sequentially formed thereon, thus completing a donor film for LITI.

The emission layer of the donor film was subjected to LITI to form an emission layer on the organic soluble hole transport layer, and was annealed at 120° C. for approximately 1 hour, followed by cooling and loading into an organic evaporator. Subsequently, BAlq and Alq$_3$ were sequentially deposited to thicknesses as shown in Table 1 to form an HBL and an ETL. Next, LiF and Al were sequentially deposited on the ETL to form an LiF layer having a thickness of 1 nm and an Al layer having a thickness of 300 nm, thus completing an organic EL device.

EXAMPLE 6

The same procedure as in Example 5 was performed, except that a thickness of the Alq3 layer (ETL) was changed to 5.5 nm, thus completing an organic EL device.

EXAMPLE 7

The same procedure as in Example 6 was performed except that after forming the emission layer, the annealing temperature was changed to 170° C., thereby completing an organic EL device.

EXAMPLES 8–12

A patterned ITO substrate was washed and subjected to UV-$O_3$ treatment for 15 minutes, followed by spin-coating a composition for forming a hole injection layer (PEDOT/PSS manufactured by BAYER) to a thickness of 62 nm at a rate of 5000 rpm, and drying at 200° C. for 5 minutes in a globe box, thus forming a hole injection layer.

A composition for forming an emission layer was spin coated onto the hole injection layer to a thickness of 65 nm at a rate of 4000 rpm, thus forming an emission layer. As the composition for forming an emission layer, a mixture of 0.1 to 0.05 g of BFE polymer (manufactured by DOW CHEMICAL CO.) and 10 mL of toluene was used.

Next, the same procedure was carried out to provide a unit cell. The cell was annealed at 120° C. for approximately 1 hour, followed by cooling and loading into an organic evaporator. Subsequently, BAlq and $Alq_3$ were sequentially deposited to thicknesses as shown in Table 1 to form an HBL and an ETL. Then, LiF and Al were sequentially deposited on the ETL to form an LiF layer having a thickness of 1 nm and an Al layer having a thickness of 300 nm to produce a second electrode, thus completing an organic EL device.

EXAMPLE 13

The same procedure as in Example 12 was performed, except that a thickness of the Alq3 layer (ETL) was changed to 7.5 nm, thus completing an organic EL device.

EXAMPLE 14

A patterned ITO substrate was washed and subjected to UV-$O_3$ treatment for 15 minutes, followed by spin-coating a composition for forming a hole injection layer (PEDOT/PSS manufactured by BAYER) to a thickness of 62 nm at a rate of 5000 rpm, and drying at 200° C. for 5 minutes in a globe box, thus forming a hole injection layer.

A composition for forming an emission layer was spin-coated onto the hole injection layer to a thickness of 60 nm at a rate of 4000 rpm, thus forming an emission layer. As the composition for forming an emission layer, a mixture of 0.1 to 0.05 g of BFE polymer (manufactured by DOW CHEMICAL CO.) and 10 mL of toluene was used.

After forming the emission layer, the emission layer was annealed at 135° C. for approximately 1 hour, and $Alq_3$ was deposited on the emission layer to a thickness of 5.5 nm to form an ETL.

Then, LiF and Al were sequentially deposited on the ETL to form an LiF layer having a thickness of 1 nm and an Al layer having a thickness of 300 nm to produce a second electrode, thus completing an organic EL device.

EXAMPLE 15

The same procedure as in Example 14 was performed, except that after forming the emission layer, the annealing temperature was changed to 170° C. from 135° C., thus completing an organic EL device.

EXAMPLE 16

The same procedure as in Example 12 was performed, except that COVION BLUE (manufactured by DOW CHEMICAL CO.) was used as the emissive polymer to form the composition for forming the emission layer, instead of BLUE-J (manufactured by DOW CHEMICAL CO.)

EXAMPLE 17

The same procedure as in Example 16 was performed, except that the $Alq_3$ layer was formed on an emission layer to a thickness of 10 nm, thus completing an organic EL device.

COMPARATIVE EXAMPLE 1 COMP. EX. 1

The same procedure as in Example 1 was performed, except that a second electrode was formed on the emission layer without forming a metal infiltration preventing layer, thus completing an organic EL device.

For the organic EL devices prepared in Examples 1–5, 8–12 and Comparative Example 1, color coordinate, efficiency, driving voltage and lifetime characteristics were evaluated, and the results thereof are shown in Table 1.

In Table 1, a lifetime characteristic is represented by a half-life period, that is, a time required until the luminance of each device is reduced to 50% of an initial luminance.

TABLE 1

| | Thickness of HBL layer (nm) | Thickness of ETL layer (nm) | Color coordinate (y) | Efficiency | Lifetime @ 100 nits |
|---|---|---|---|---|---|
| Example 1 | 5.5 | 0 | 0.26 | 3.0 | 87 |
| Example 2 | 5.5 | 10 | 0.31 | 5.7 | 350 |
| Example 3 | 5.5 | 5 | 0.28 | 5.7 | 385 |
| Example 4 | 0 | 10 | 0.30 | 5.0 | 330 |
| Example 5 | 0 | 5 | 0.27 | 3.1 | 360 |
| Example 8 | 5.5 | 0 | 0.25 | 2.5 | 58 |
| Example 9 | 5.5 | 10 | 0.30 | 5.5 | 280 |
| Example 10 | 5.5 | 5 | 0.27 | 5.5 | 270 |
| Example 11 | 0 | 10 | 0.29 | 4.1 | 240 |
| Example 12 | 0 | 5 | 0.25 | 2.9 | 260 |
| Comp. Ex. 1 | 0 | 0 | 0.23 | 1.2 | 2.5 |

As shown in Table 1, while the conventional organic EL device having only an emission layer, without HBL and ETL, prepared in Comparative Example 1, had a half-life period of 2.5 hours, the organic EL devices having an HBL and/or an ETL as a metal infiltration preventing layer, prepared in Example 8 had a half-life period of 58 hours and in Examples 9–12 had a half-life period up to 280 hours, which is approximately 100 times longer than that of the conventional organic EL device. Also, the overall lifetime characteristics of the organic EL devices prepared in Example 1 had a half-life period of 87 hours and in Examples 2–5 in which an HBL and/or an ETL were provided as a metal infiltration preventing layer, an emission layer was formed by LITI, and an HTL was further provided, yielding a half-life period that was improved up to approximately 385 hours, which is approximately 100 times longer than that of the conventional organic EL device.

Figure 4A:
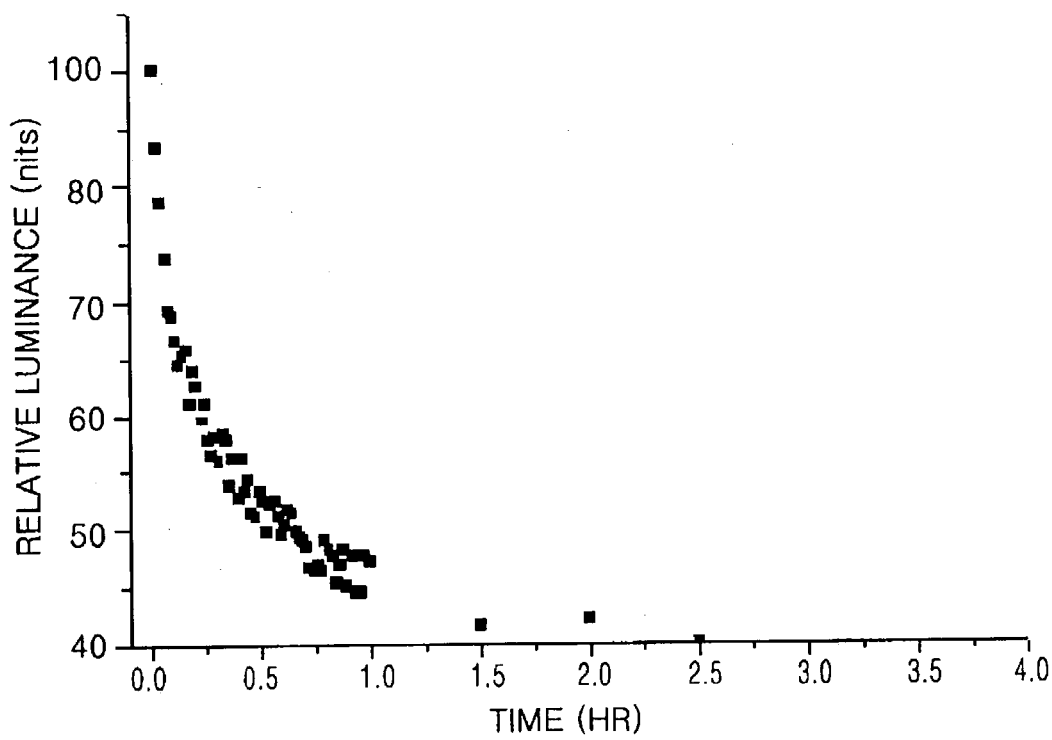
FIGS. 4A and 4B illustrate a change in luminance over time in organic EL devices according to Comparative Example 1 and Example 12 of the present invention.
Figure 4B:
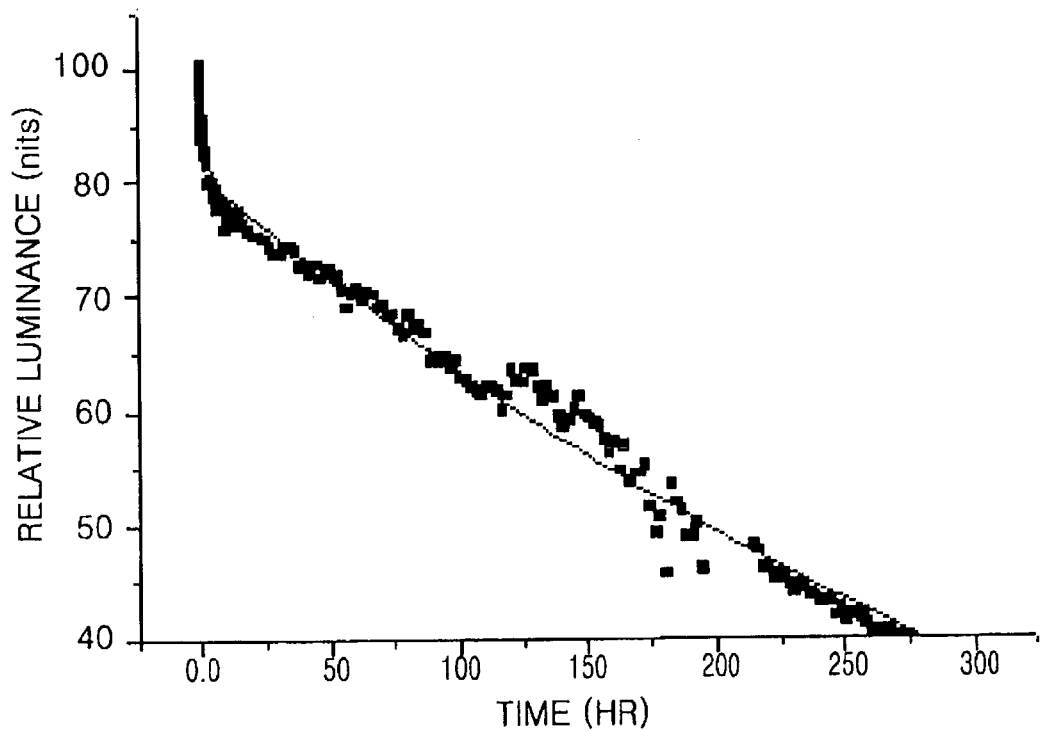

Also, lifetime characteristics of the organic EL devices prepared in Comparative Example 1 and Example 12 of the present invention, were evaluated, and the results thereof are shown in FIGS. 4A and 4B, in which FIG. 4A is a graphical representation of the lifetime of the organic EL device prepared in Comparative Example 1, and FIG. 4B is a graphical representation of the lifetime of the organic EL device prepared in Example 12, respectively.

Referring to FIGS. 4A and 4B, the organic EL device prepared in Example 12 has a noticeably improved lifetime characteristic compared to that of Comparative Example 1.

Various properties of the organic EL devices prepared in Examples 6–7 and 14–15 and Comparative Example 1, were evaluated, and the results thereof are shown in Table 2.

TABLE 2

| | Annealing temperature (° C.) | Color coordinate (y) | Efficiency | Lifetime @ 100 nits |
|---|---|---|---|---|
| Example 6 | 120 | 0.20 | 2.5 | 330 |
| | 120 | 0.21 | 2.3 | 375 |
| Example 7 | 170 | 0.19 | 2.7 | 915 |
| | 170 | 0.21 | 2.5 | 680 |
| Example 14 | 135 | 0.19 | 1.9 | 285 |
| | 135 | 0.19 | 1.9 | 250 |
| Example 15 | 170 | 0.18 | 1.9 | 610 |
| | 170 | 0.19 | 2 | 486 |
| Comp. Ex. 1 | 120 | 0.23 | 1.2 | 2.5 |

As shown in Table 2, the organic EL devices prepared in Examples 6–7 and 14 and 15, in which annealing was performed after forming an emission layer, and an ETL was formed, had improved lifetime characteristics compared to the organic EL device having only an emission EL device prepared in Example 1. In particular, the maximum cycle lifetime of the organic EL device prepared in Example 7 was approximately 915 hours.

Figure 5:
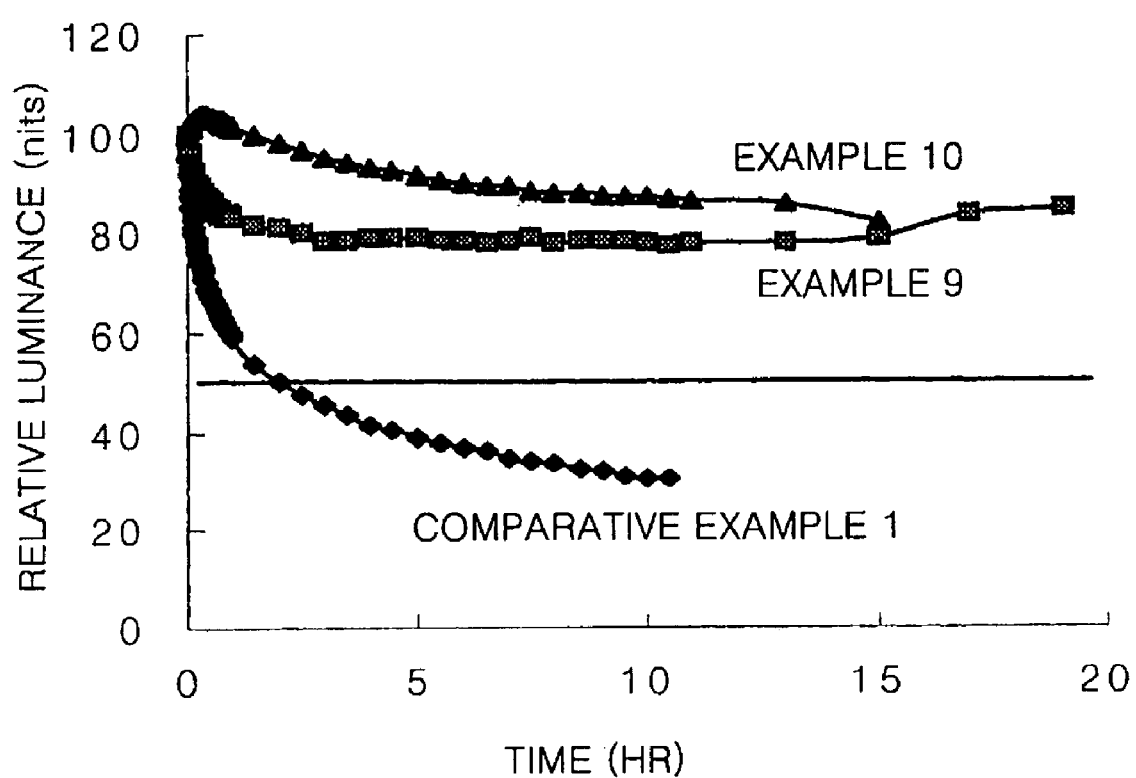
FIG. 5 illustrates a change in luminance over time in organic EL devices according to Comparative Example 1 and Examples 16 and 17 of the present invention.

Emission efficiencies of the organic EL devices prepared in Comparative Example 1 and Examples 9–10 of the present invention were evaluated, and the results thereof are shown in FIG. 5. Referring to FIG. 5, the emission efficiencies of the organic EL devices prepared in Examples 9–10 were slightly reduced as a function of time, but the reduction is much smaller than that of Comparative Example 1. As to lifetime characteristics, the organic EL devices prepared in Examples 9–10 had much better lifetime characteristics than the conventional organic EL device.

In the organic EL device according to the present invention, a metal for forming a second electrode can be effectively prevented from infiltrating into the emission layer by the infiltration preventing layer. Thus, according to the present invention, the lifetime and efficiency characteristics of the organic EL device can be greatly improved compared to the case in which a metal infiltration preventing layer is not formed.

The organic EL device of the present invention may be utilized to provide a display in an electronic device. For example, the present invention may be implemented in a display of one of a pager, a cellular telephone, a portable telephone, a two-way radio, a video game, a portable digital assistant, a portable television, a portable computer, a notebook computer, a calculator, a computer, a telephone, a check-out device that registers purchases, a monitoring device, a digital clock, and the like.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic EL device comprising:
a substrate;
a first electrode disposed on the substrate;
an emission layer comprising a polymer disposed on the first electrode;
a second electrode formed on the emission layer; and
a metal infiltration preventing layer comprising a hole blocking layer and an electron transport layer, disposed between the emission layer and the second electrode, to prevent metal from the second electrode from infiltrating into the emission layer,
wherein the metal infiltration preventing layer exhibits a thickness of 4 to 7 nm.

2. The organic EL device according to claim 1, wherein the hole blocking layer includes at least one compound selected from the group of compounds consisting of phenanthrolines, imidazoles, triazoles, oxadiazoles, aluminum complexes, and fluorinated compounds.

3. The organic EL device according to claim 1, wherein the electron transport layer includes at least one material selected from the group of materials consisting of oxazoles, isooxazoles, triazoles, isothiazoles, oxadiazoles, thiadiazoles, perylenes, aluminum complexes, and gallium complexes.

4. The organic EL device according to claim 1, further comprising a hole injection layer provided between the first electrode and the emission layer.

5. The organic EL device according to claim 1, wherein the hole injection layer includes at least one material selected from the group of materials consisting of PEDOT {poly(3, 4-ethylenedioxythiophene)}/PSS(polystyrene parasulfonate) and starburst materials.

6. The organic EL device according to claim 1, further comprising a thin film transistor (TFT) between the substrate and the first electrode, and an insulator layer disposed on the TFT, wherein the first electrode is connected to source/drain electrodes of the TFT through a via hole of the insulator layer.

7. An electronic device having a display comprising an organic EL device in accordance with claim 1.

8. The electronic device of claim 7, wherein the electronic device is one of a pager, a cellular telephone, a portable telephone, a two-way radio, a video game, a portable digital assistant, a portable television, a portable computer, a notebook computer, a calculator, a computer, a telephone, a check-out device that registers purchases, a monitoring device, and a digital clock.

9. An organic EL device, comprising:
a substrate;
a first electrode disposed on the substrate;
an emission layer comprising a polymer disposed on the first electrode;
a second electrode formed on the emission layer;
a hole injection layer provided between the first electrode and the emission layer;
a metal infiltration preventing layer disposed between the emission layer and the second electrode, and comprising a low molecular weight organic material, preventing metal from the second electrode from infiltrating into the emission layer, wherein a thickness of the metal infiltration preventing layer is 0.1 to 50 nm; and
an organic soluble hole transport layer disposed between the hole injection layer and the emission layer.

10. An organic EL device, comprising:
a substrate;
a first electrode disposed on the substrate;
an emission layer comprising a polymer disposed on the first electrode;
a second electrode formed on the emission layer;
a metal infiltration preventing layer comprising a low molecular weight organic material, disposed between the emission layer and the second electrode, to prevent metal from the second electrode from infiltrating into the emission layer, wherein the metal infiltration preventing layer exhibits a thickness of 0.1 to 50 nm; and a hole transport layer disposed between the first electrode and the emission layer, wherein the hole transport layer has a hole transporting capability and is selected from the group consisting of arylamine-, perylene-, carbazole-, hydrazone-, stilbene- and pyrrol-based polymers and combinations thereof; or a mixture including a polymer and a low molecular weight compound having a hole transporting capability disposed in the polymer, the polymer being selected from the group consisting of polystyrene, poly(styrene-butadiene) copolymer, polymethylmethacrylate, poly-a-methylstyrene, styrene-methylmethacrylate copolymer, polybutadiene, polycarbonate, polyethylterephthalate, polyestersulfonate, polyacrylate, fluorinated polyimide, transparent fluorine resin and transparent acryl resin and combinations thereof, and the low molecular weight compound being selected from the group consisting of arylamines, perylenes, carbazoles, stilbenes, pyrrols, starburst compounds containing derivatives and combinations thereof.

11. A method for manufacturing an organic EL device, comprising:

forming a first electrode on a substrate;

forming an emission layer comprising a polymer on the first electrode;

forming a metal infiltration preventing layer comprising a hole blocking layer and an electron transport layer on the emission layer; and forming a second electrode on the metal infiltration preventing layer, wherein the metal infiltration preventing layer exhibits a thickness of 4 to 7 nm, and serves to prevent metal from the second electrode from infiltrating into the emission layer.

12. An organic EL device, comprising:

a first electrode and a second electrode sandwiching:

an emission layer comprising a polymer;

a metal infiltration preventing layer adjacent the emission layer and the second electrode, the metal infiltration preventing layer comprising a hole blocking layer and/or an electron transport layer to prevent metal from the second electrode from infiltrating into the emission layer;

a hole injection layer disposed between the first electrode and the emission layer, to reduce contact resistance between the first electrode and the emission layer, while increasing hole transporting capability of the first electrode relative to the emission layer;

an organic soluble hole transport layer disposed between the hole injection layer and the emission layer, to prevent impurities from the hole injection layer from infiltrating into the emission layer.

* * * * *

UNITED STATES PATENT AND TRADEMARK OFFICE
CERTIFICATE OF CORRECTION

| | | |
|---|---|---|
| PATENT NO. | : 7,170,086 B2 | Page 1 of 1 |
| APPLICATION NO. | : 10/369763 | |
| DATED | : January 30, 2007 | |
| INVENTOR(S) | : Min Chul Suh et al. | |

It is certified that error appears in the above-identified patent and that said Letters Patent is hereby corrected as shown below:

Title Page, Page 2, Item (56): References Cited, Other Publications, Line 1, change "Blaggio" to -- Biaggio --

Column 19, Line 13, change
"poly-a-methylstyrene" to -- poly-α-methylstyrene --

Signed and Sealed this

First Day of May, 2007

JON W. DUDAS
*Director of the United States Patent and Trademark Office*